United States Patent
Dong

(10) Patent No.: US 8,644,365 B2
(45) Date of Patent: Feb. 4, 2014

(54) PROVIDING VOLTAGE ISOLATION ON A SINGLE SEMICONDUCTOR DIE

(75) Inventor: Zhiwei Dong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/435,179

(22) Filed: Mar. 30, 2012

(65) Prior Publication Data

US 2013/0257527 A1 Oct. 3, 2013

(51) Int. Cl.
*H04B 1/38* (2006.01)

(52) U.S. Cl.
USPC ........... 375/217; 375/220; 375/257; 375/258; 326/21

(58) Field of Classification Search
USPC ......... 326/21, 82–83; 375/219–222, 257–260
See application file for complete search history.

(56) References Cited

U.S. PATENT DOCUMENTS

| 5,495,186 | A | 2/1996 | Kanazawa | |
|---|---|---|---|---|
| 6,344,809 | B1 | 2/2002 | Kanekawa | |
| 7,737,871 | B2 * | 6/2010 | Leung et al. | 341/100 |
| 7,804,859 | B2 * | 9/2010 | Landry et al. | 370/535 |
| 7,902,627 | B2 * | 3/2011 | Dong et al. | 257/499 |
| 8,169,108 | B2 * | 5/2012 | Dupuis et al. | 307/109 |
| 8,198,951 | B2 | 6/2012 | Dong | |
| 2003/0145121 | A1 | 7/2003 | Watkins | |
| 2006/0250155 | A1 | 11/2006 | Chen | |
| 2008/0315925 | A1 | 12/2008 | Alfano | |
| 2009/0017773 | A1 | 1/2009 | Dupuis | |
| 2009/0027243 | A1 * | 1/2009 | Leung et al. | 341/100 |
| 2009/0213914 | A1 | 8/2009 | Dong et al. | |
| 2010/0150338 | A1 * | 6/2010 | Nguyen | 379/412 |
| 2010/0327930 | A1 | 12/2010 | Yan et al. | |
| 2011/0050198 | A1 | 3/2011 | Dong | |
| 2012/0161841 | A1 | 6/2012 | Dong | |

OTHER PUBLICATIONS

U.S. Patent and Trademark Office, Office Action mailed Jan. 10, 2013, with Reply filed Mar. 27, 2013 in U.S. Appl. No. 13/436,146.
U.S. Appl. No. 13/436,146, filed Mar. 30, 2012, entitled "Capacitive Isolation Receiver Circuitry" by Zhiwei Dong, et al.

* cited by examiner

Primary Examiner — Vibol Tan
(74) Attorney, Agent, or Firm — Trop, Pruner & Hu, P.C.

(57) ABSTRACT

In one embodiment, a method includes receiving an input signal in transmitter circuitry of a first semiconductor die and processing the input signal, sending the processed input signal to an isolation circuit of the die to generate a voltage isolated signal, and outputting the voltage isolated signal from the isolation circuit to a second semiconductor die coupled to the first semiconductor die via a bonding mechanism. Note that this second semiconductor die may not include isolation circuitry.

18 Claims, 3 Drawing Sheets

PROVIDING VOLTAGE ISOLATION ON A SINGLE SEMICONDUCTOR DIE

BACKGROUND

In many different systems, an isolation barrier can be provided to enable communication of signals across a given type of the isolation. Existing solutions for providing isolation links include the use of magnetic pulse couplers, magnetic resistive couplers, capacitive couplers and optical couplers. Other isolation functions include control of high voltage circuitry.

However, the isolation provided by the different types of barriers can have consequences for implementations in certain types of circuit designs. For example, with capacitive isolation provided by way of capacitors present on multiple die, which can be multiple die implemented within a single integrated circuit (IC) package, the presence of isolation circuitry on each die has the presence of certain isolation circuitry that generally uses one of particular and often complex semiconductor processes. For example, a complementary metal oxide semiconductor (CMOS) process is typically used that provides for the ability to have many layers of metal circuitry to realize the isolation circuit. As one such example, these capacitive isolation barriers can be formed using a 0.25 micron (μm) process. However, as a special semiconductor process is used for the isolation circuitry, the ability to utilize such isolation circuitry in connection with certain types of circuitry that does not have such process limitations is restricted.

SUMMARY OF THE INVENTION

According to one aspect, the present invention is directed to a semiconductor die having a transmitter circuit to receive an input signal and to output a differential signal corresponding to the input signal. This die further may include isolation circuitry to provide voltage isolation between the semiconductor die and a second semiconductor die coupled to it. This isolation circuitry may be implemented solely within the first semiconductor die, enabling greater flexibility in a semiconductor process used to fabricate the second die. Thus in exemplary embodiments, the second semiconductor die can be of a different semiconductor process than the first semiconductor die. In addition, various types of circuitry may be present on the second semiconductor die such as an application circuit, which may be a subscriber line interface circuit (SLIC), a power over Ethernet (POE) circuit, or other such device.

Another aspect of the present invention is directed to an apparatus with multiple semiconductor packages. One such package may include a first semiconductor die having a transmitter circuit to receive an input signal and to output a differential signal corresponding to the input signal, and an isolation circuit including a first pair of isolation capacitors to receive the differential signal and a second pair of isolation capacitors coupled to the first pair of isolation capacitors to receive the differential signal and to output an isolated differential signal. A second such package may be coupled to this package and may include a second semiconductor die to receive the isolated differential signal from the first semiconductor die via first and second input pads. Note that the isolation circuit of the first semiconductor package provides complete voltage isolation between the first and second semiconductor packages. In this way, the second semiconductor die can be of a different semiconductor process than the first semiconductor die.

A still further aspect of the present invention is directed to a method for receiving an input signal in transmitter circuitry of a first semiconductor die and processing the input signal, sending the processed input signal to an isolation circuit of the die to generate a voltage isolated signal, and outputting the voltage isolated signal from the isolation circuit to a second semiconductor die coupled to the first semiconductor die via a bonding mechanism. Note that this second semiconductor die may not include isolation circuitry, as the isolation circuitry present on the first semiconductor die may be sufficient to provide complete voltage isolation between the dies. In an exemplary embodiment, the voltage isolated signal may be processed in the second semiconductor die to obtain the input signal, which can then be sent to selected circuitry of the second semiconductor die. In this exemplary embodiment, the two dies can be capacitively coupled via the isolation circuit of the first semiconductor die.

DETAILED DESCRIPTION

In various embodiments, complete isolation circuitry can be provided on a single semiconductor die. In this way, another circuit to which the isolation circuitry is coupled, e.g., a second semiconductor die, is not restricted to be fabricated on the same semiconductor fabrication process as the first die that includes the isolation circuitry. Accordingly, embodiments can enable isolation circuitry to be used in connection with various types of circuits that take advantage of other semiconductor processes such as more advanced processes, e.g., of an advanced technology node (e.g., a 90 nanometer (nm) or a 45 nm process). Although the scope of the present invention is not limited in this regard, examples of the types of circuits to which an isolation circuit can be coupled may include a microcontroller unit (MCU), a subscriber line interface circuit (SLIC), a power over Ethernet (POE) circuit, a power driver, or other types of circuits.

Although the isolation circuitry is present only on a single die, a high degree of voltage isolation between the dies is still possible. For example, by providing isolation in accordance with an embodiment of the present invention, a voltage isolation between two semiconductor die of at least approximately 5 kilovolts (kV) can still be realized. Such voltage isolation is sufficient for many different types of applications.

Figure 1:
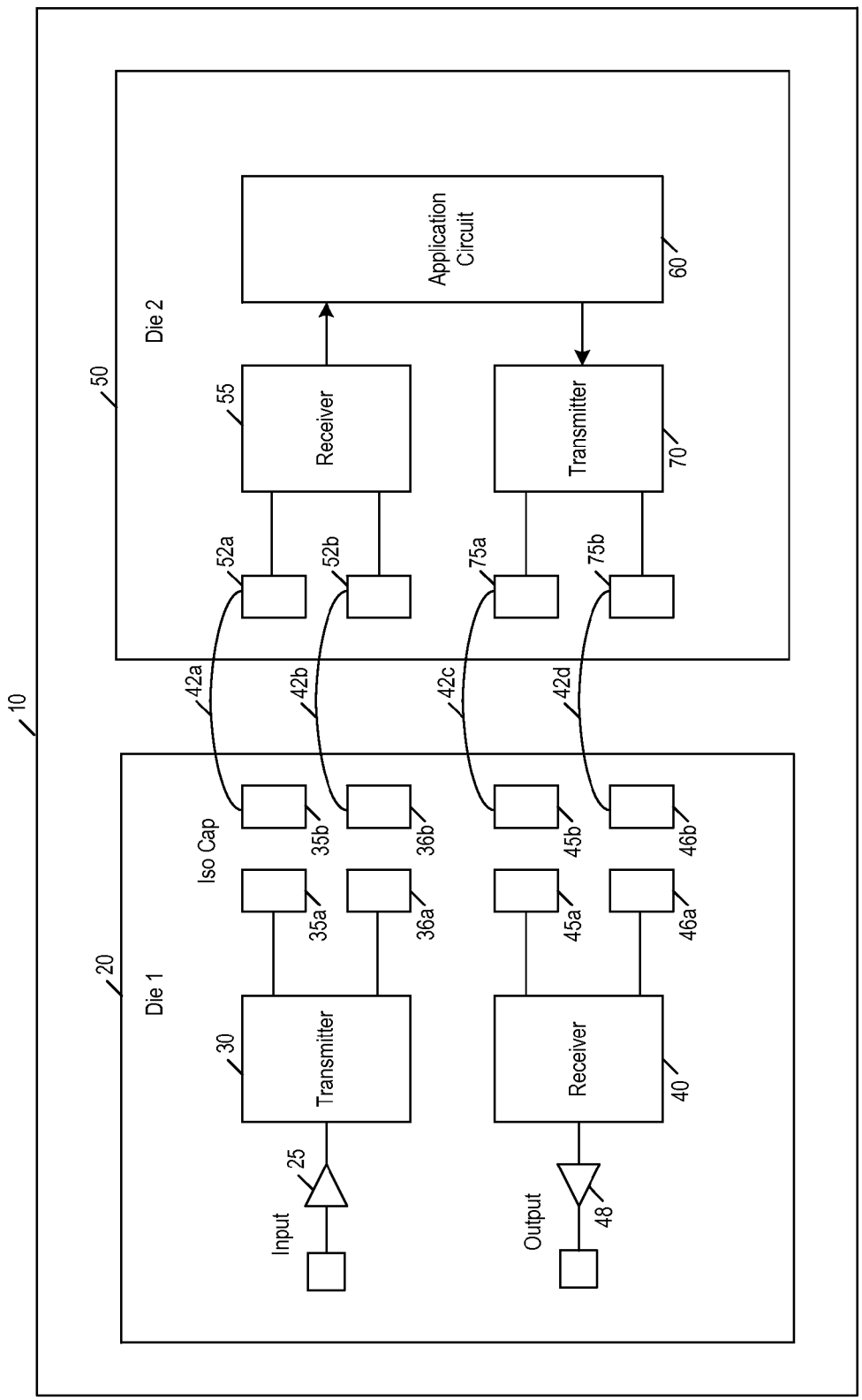
FIG. 1 is a high level block diagram of a semiconductor package in accordance with an embodiment of the present invention.

Referring now to FIG. 1, shown is a high level block diagram of a semiconductor package in accordance with an embodiment of the present invention. As shown in FIG. 1, IC 10 may be a multi-chip module (MCM) IC including a first die 20 and a second die 50. In the embodiment of FIG. 1, first die 20 may include isolation circuitry in accordance with an exemplary embodiment. As one example, the isolation circuitry may be realized via a capacitive isolation barrier. However, the scope of the present invention is not limited in this regard and in other embodiments such isolation circuitry can be realized by another type of isolation barrier such as a magnetic isolator, optical isolator or so forth.

With reference to FIG. 1, first die 20 may include transmitter circuitry and receiver circuitry. Note that although both transmitter and receiver circuitry is present in the embodiment of FIG. 1, it is possible for a given embodiment to provide a single direction of data communication, e.g., transmit only or receive only.

As seen, for incoming signals, which may be incoming digital signals from various circuitry either present on the die (not shown for ease of illustration in FIG. 1) or from another location, the data is provided to a buffer 25, which may buffer or otherwise condition the signal and provide it to transmitter circuitry 30. In various embodiments, transmitter circuitry 30 can provide a given type of modulation to the data signal as well as condition the signal in an appropriate manner. As further seen, it is possible to take an incoming single-ended signal and convert it into a differential data stream. However, persons of ordinary skill in the art understand that in other embodiments, single-ended communication between the different die are possible. Thus the output of transmitter circuitry 30 may be a differential signal that is provided to isolation circuitry present solely on first die 20.

Specifically in the embodiment shown in FIG. 1, this isolation circuitry can be realized by pairs of isolation capacitors 35a and 35b and 36a and 36b that are coupled via an on-die link (not shown for ease of illustration in FIG. 1). Specifically isolation capacitor 35a couples to isolation capacitor 35b and isolation capacitor 36a couples to isolation capacitor 36b. In one exemplary embodiment, these isolation capacitors can be formed as, e.g., vertical, horizontal or finger capacitors. The isolation material may be silicon oxide or other insulation material. The isolation capacitors may range in an exemplary embodiment, e.g., from 18-35 femtoFarads. Persons of skill in the art recognize that other embodiments may utilize bigger or smaller capacitors. In one exemplary embodiment, first die 20 can be formed of a CMOS process such as a 0.25 µm process. And in this embodiment, the capacitors themselves can be implemented via a multi-level metal structure such as a 6 or 7 metal layer structure. By providing these multiple isolation capacitors on a single die, a relatively high level of voltage isolation is realized, which can be sufficient for many different types of applications.

The data is transmitted across the isolation barrier by driving a differential signal across the isolation capacitors 35a and 35b such that energy is coupled across the capacitors. This allows energy forming a voltage isolated signal to be transmitted on transmission lines that couple the two die. A first plate of capacitors 35a and 36a is associated with the input signal, and energy associated therewith is coupled across the high voltage isolation barrier created by the capacitors. Note that there will be a loss associated with the coupling coefficient across the capacitor such that the amount of energy that can be delivered from the transmit side to the receive side is reduced. While FIG. 1 shows that both dies include transmitter circuitry and receiver circuitry, in other embodiments, one of the die may include transmitter or receiver circuitry with the partnered die including a corresponding receiver or transmitter. In one embodiment, the signals generated within the transmit circuitry on one side of the capacitive isolation link can be RF signals that are transmitted between the die as voltage isolated signals utilizing the connection through the isolation present in a single die.

As further seen in FIG. 1, the isolated signal from isolation capacitor 35b can be communicated to second die 50 via an appropriate connection such as a bonding wire 42a. In the embodiment of FIG. 1, an output bond pad may thus be formed as a top metal layer of this isolation capacitor 35b. Similar isolation circuitry for the differential signal is realized via isolation capacitors 36a and 36b that can be formed similarly to isolation capacitors 35a and 35b. And the isolated signal from isolation capacitor 36b (and more specifically via an output bond pad fabricated on a top metal layer) can be communicated via wire bond 42b to second die 50.

As seen with respect to second die 50, the incoming isolated differential signals may be provided to input pads 52a and 52b of the second die. Because there is no isolation circuitry present on this second die, note that these input pads can be formed in a relatively simple manner, e.g., as one or two metal layer data pads. As such, no isolation may be present, and thus there is no process restriction on the die, and thus greater flexibility exists to form second die 50 of a semiconductor process appropriate for additional circuitry of the die.

Still referring to FIG. 1, the incoming differential signals can be provided to a receiver circuit 55 which may perform various processing on the received signals, including various signal conditioning, demodulation and so forth. Accordingly, the output of receiver circuit 55 may be the recovered signal that was originally provided to transmitter circuitry 30. This given digital signal can be provided to an application circuit 60, which may be the primary circuitry of second die 50. Although the scope of the present invention is not limited in this regard, as examples the application circuitry can take the form of an MCU, a SLIC, a POE circuit, or an input/output circuit. Other types of circuitry may include a driver circuit, a bus or other interface circuit such as an I²C circuit, an SPI circuit, an RS232 circuit, or other type of bus or power circuit.

In addition to the transmitter circuitry of first die 20 and receiver circuitry of second die 50, corresponding transmitter and receiver circuitry can be present in second die 50 and first die 20, respectively. Thus as seen in FIG. 1, signals output by application circuit 60 can be provided to a transmitter circuit 70, which can operate as discussed above with regard to transmitter circuit 30 to thus output differential signals to a pair of output pads 75a and 75b, which may be relatively simple data pads as described above. The signals then may be communicated via wire bonds 42c and 42d to an isolation circuit on first die 20 formed of isolation capacitors 45a and 45b and 46a and 46b. These isolation capacitors can be formed as described above with regard to capacitors 35a and 35b. The received and now isolated signals may then be provided to a receiver circuit 40, which may perform various conditioning and processing to obtain the original signal output by application circuit 60. As seen, this signal can be communicated through a buffer 48 or an inverter from where it can then be output to various circuitry, e.g., within first die 20 or another location. Although shown at this relatively high level in the embodiment of FIG. 1, persons of skill in the art understand the scope of the present invention is not limited in this regard.

Transmitter circuit 30 and receiver circuit 40 thus may be fabricated utilizing conventional processing techniques and available conductive layers. In an exemplary embodiment, isolation capacitors are utilized on only one side of the isolation link and the loss through the isolation link is small enough to significantly reduce the amplification requirements or even avoid a receive amplifier completely. The capacitive isolation link thus may be implemented in a single one of two galvanically isolated dies between which a high rate data link with voltage isolation is desired.

By providing an embodiment such as that in FIG. 1 in which isolation circuitry is completely present on a first die, and a second die does not include any such isolation circuitry, embodiments realize a great degree of freedom to fabricate second die 50 with any type of semiconductor process. As examples and not for purposes of limitation, such semiconductor processes can include CMOS and non-CMOS processes and may be, for example, of a given technology node such as a 0.18 micron process, a 130 nm process or a 90 nm process. IC package 10 of FIG. 1 can thus be any given type of isolation (ISO)-application circuit such as an ISO-MCU, ISO-SLIC, ISO-POE or other ISO-application circuit.

To provide even greater flexibility, other embodiments can provide isolation circuitry in a first package and communicate isolated signals with circuitry present in another package. In this way, inherent complexities associated with an MCM can be avoided. Furthermore, even greater flexibility as to the type of application circuit present in the non-isolation package, as well as potentially greater voltage isolation benefits can be achieved.

Figure 2:
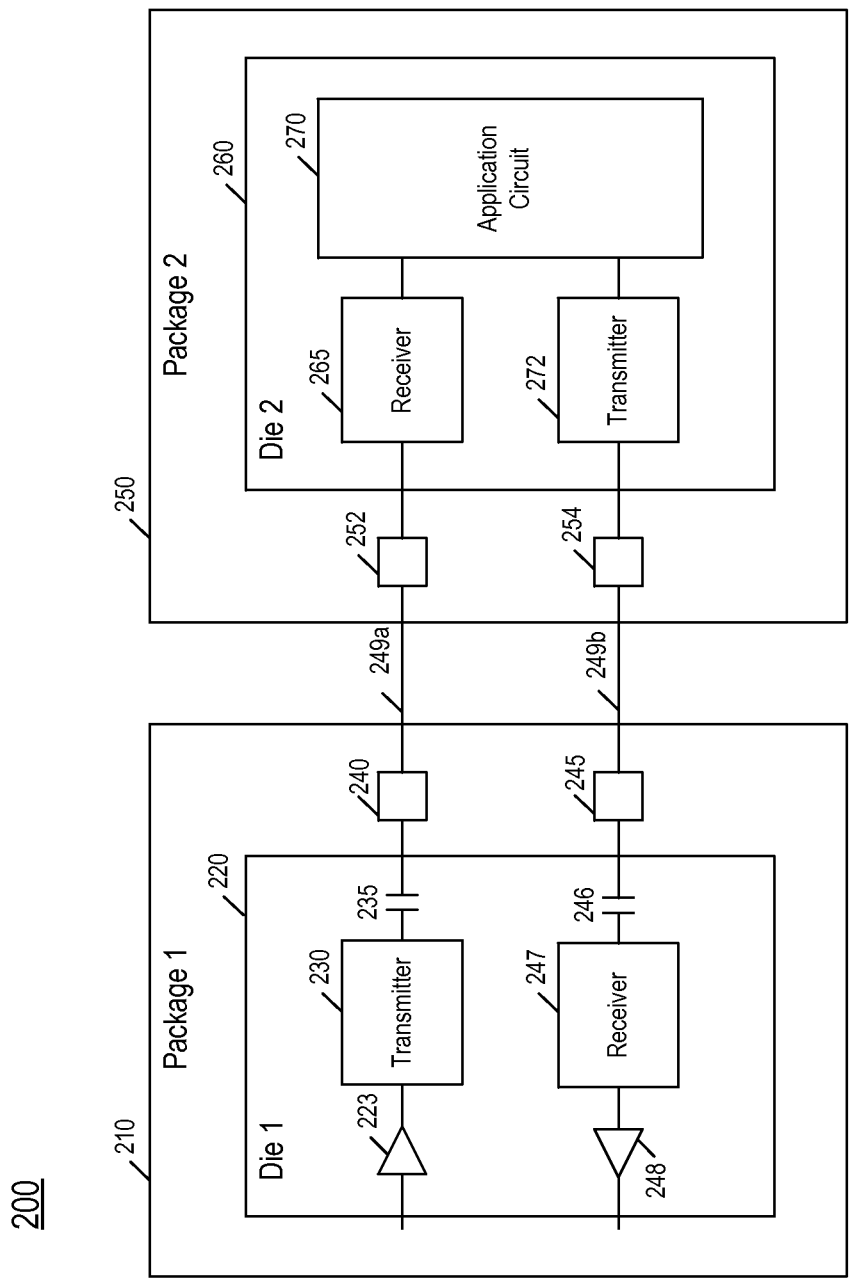
FIG. 2 is a high level block diagram of another embodiment of the present invention.

Referring now to FIG. 2, shown is a high level block diagram of another embodiment of the present invention. As shown in FIG. 2, system 200 includes multiple semiconductor packages including a first IC package 210 and a second IC package 250. These packages can be coupled by corresponding links 249a and 249b. In various embodiments, these links can be conductive traces on a circuit board such as a motherboard, wire bonds, or other off-chip interconnects. In the embodiment shown in FIG. 2, first package 210 may include complete isolation circuitry such that second package 250 can be formed of any given semiconductor process and not include any isolation circuitry.

As generally shown in FIG. 2, first die 220 may include similar circuitry as present in the first die described above with regard to FIG. 1. For example, transmitter circuitry 230 and receiver circuitry 247 may be present. In addition, an input buffer 223 can couple to transmitter circuitry 230 and an output buffer 248 can couple to the output of receiver circuitry 247. In addition, isolation circuitry, generally shown as isolation circuits 235 and 246 may be present. Although shown with single capacitors, persons of ordinary skill in the art understand that these isolation circuits, when implemented as a capacitive isolation barrier, can each include multiple capacitors coupled via an on-die link. In addition, persons of ordinary skill in the art understand that the capacitor that directly couples to an off-die component can be implemented as a multiple or many layer metal capacitor and additionally may include as a top metal layer a data pad to provide interconnection, e.g., as an input or output connection on first die 220 and an off-die data pad (e.g., pads 240 and 245) which can be package pads that in turn enable interconnection via transmission lines such as links 249a and 249b.

Similarly, second die 260 implemented in second package 250 can include receiver circuitry 265, transmitter circuitry 272, and an application circuit 270. Note that because no isolation circuitry is present on this die, the die can be fabricated with any desired semiconductor process such as a given process appropriate for the particular type of application circuit. As further seen, communications between the packages can be realized via transmission lines 249a and 249b, which couple between package pads 240 and 245 of first package 210 and package pads 252 and 254 of second package 250. Although shown at this high level in the embodiment of FIG. 2, persons of ordinary skill in the art understand that the scope of the present invention is not limited in this regard.

Figure 3:
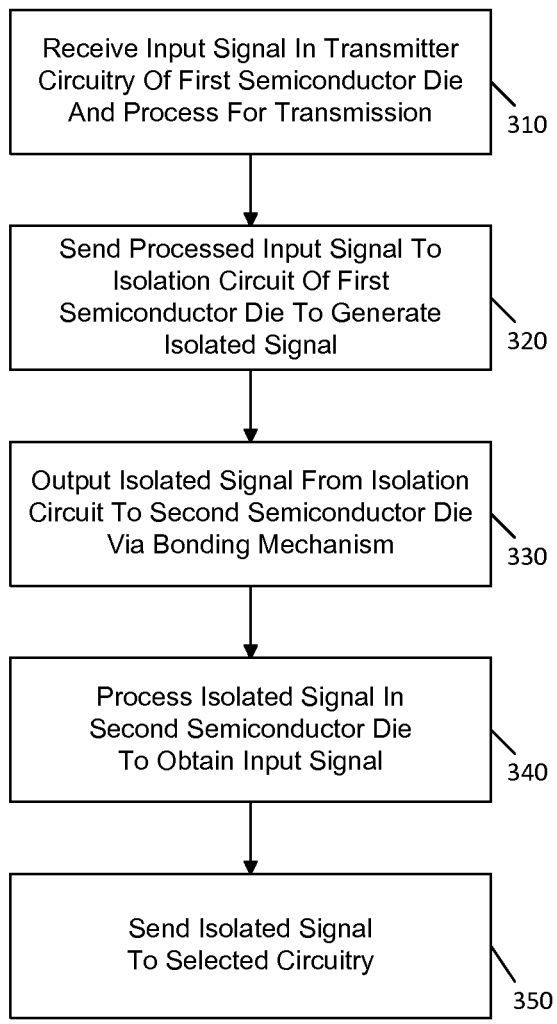
FIG. 3 is a flow diagram of a method in accordance with an embodiment of the present invention.

Referring now to FIG. 3, shown is a flow diagram of a method in accordance with an embodiment of the present invention. Method 300 of FIG. 3 can be implemented in any type of system that includes isolation circuitry in accordance with an embodiment of the present invention. For example, embodiments can be implemented in various types of ISO-application circuits. As seen, FIG. 3 may begin by receiving an input signal in transmitter circuitry of a first semiconductor die and processing this signal (block 310). For example, an incoming single-ended signal can be processed to generate a differential signal for transmission to another die.

Method 300 continues at block 320 by sending this processed input signal to isolation circuitry of the first semiconductor die. As one example, this isolation circuitry can include one or more pairs of isolation capacitors to provide a high degree of voltage isolation that can thus generate a voltage isolated signal. An example, the isolation circuitry may be that such as present in the embodiments of FIG. 1 or 2. Next, method 300 passes to block 330 where the isolated signal can be output from the isolation circuit to the second semiconductor die, e.g., via a bonding mechanism. This bonding mechanism may be a given off-chip interconnect such as bond wire mechanism between two dies within a single package, an inter-package on-board interconnect when the two semiconductor die are present in different ICs, or another type of interconnect.

Still referring to FIG. 3, this output isolated signal can be received, e.g., via one or more input pads of the second semiconductor die which, due to the lack of isolation circuitry in this second semiconductor die can be of a relatively simple design. Control next passes to block 340 where the isolated signal can be processed in the second semiconductor die to thus obtain or recover the original input signal. Accordingly, this now recovered signal can be sent to selected circuitry (block 350). This circuitry for example may be application circuitry of the second semiconductor die, or it may be another destination location such as some other circuitry, either present on the second semiconductor die or another die coupled thereto. Although shown at this high level in the embodiment of FIG. 3, persons of ordinary skill in the art understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first semiconductor die including a first transmitter circuit to receive an input signal and to output a differential signal corresponding to the input signal, the first semiconductor die further including isolation circuitry to provide voltage isolation between the first semiconductor die and a second semiconductor die coupled to the first semiconductor die, the isolation circuitry implemented solely within the first semiconductor die and comprising:
 a first isolation capacitor coupled to receive a first portion of the differential signal;
 a second isolation capacitor coupled to receive a second portion of the differential signal;
 a third isolation capacitor coupled to receive the first portion of the differential signal from the first isolation capacitor; and
 a fourth isolation capacitor coupled to receive the second portion of the differential signal from the second isolation capacitor.

2. The apparatus of claim 1, further comprising the second semiconductor die coupled to receive the differential signal from the first semiconductor die.

3. The apparatus of claim 2, wherein the second semiconductor die is of a different semiconductor fabrication process than the first semiconductor die.

4. The apparatus of claim 3, wherein the second semiconductor die includes an application circuit.

5. The apparatus of claim 4, wherein the application circuit comprises a microcontroller unit (MCU).

6. The apparatus of claim 4, wherein the application circuit comprises a subscriber line interface circuit (SLIC).

7. The apparatus of claim 4, wherein the application circuit comprises a power over Ethernet (POE) circuit.

8. The apparatus of claim 1, further comprising a multi-chip semiconductor package including the first and second semiconductor dies, wherein the first semiconductor die is coupled to the second semiconductor die by at least first and second bonding mechanisms.

9. The apparatus of claim 8, wherein the first bonding mechanism is coupled to a first output pad of the first semiconductor die, the first output pad incorporating the third isolation capacitor and coupled to a first input pad of the second semiconductor die that does not include isolation circuitry.

10. The apparatus of claim 2, wherein the first semiconductor die is of a first semiconductor package and the second semiconductor die is of a second semiconductor package, the first and second semiconductor packages coupled via a circuit board interconnect.

11. An apparatus comprising:
  a first semiconductor package including:
    a first semiconductor die having a first transmitter circuit to receive an input signal and to output a differential signal corresponding to the input signal, and an isolation circuit including a first pair of isolation capacitors to receive the differential signal and a second pair of isolation capacitors coupled to the first pair of isolation capacitors to receive the differential signal and to output an isolated differential signal; and
  a second semiconductor package coupled to the first semiconductor package, the second semiconductor package including:
    a second semiconductor die to receive the isolated differential signal from the first semiconductor die via first and second input pads, wherein the isolation circuit of the first semiconductor package provides complete voltage isolation between the first and second semiconductor packages.

12. The apparatus of claim 11, wherein the second semiconductor die is of a different semiconductor fabrication process than the first semiconductor die.

13. The apparatus of claim 11, wherein the first pair of isolation capacitors comprises:
  a first isolation capacitor coupled to receive a first portion of the differential signal; and
  a second isolation capacitor coupled to receive a second portion of the differential signal.

14. The apparatus of claim 13, wherein the second pair of isolation capacitors comprises:
  a third isolation capacitor coupled to receive the first portion of the differential signal from the first isolation capacitor; and
  a fourth isolation capacitor coupled to receive the second portion of the differential signal from the second isolation capacitor.

15. The apparatus of claim 11, wherein the first semiconductor package is coupled to the second semiconductor package via an on-board interconnect.

16. A method comprising:
  receiving an input signal in transmitter circuitry of a first semiconductor die and processing the input signal;
  transmitting the processed input signal to an isolation circuit of the first semiconductor die to generate a voltage isolated signal, the isolation circuit comprising a first isolation capacitor coupled to receive a first portion of the processed input signal, a second isolation capacitor coupled to receive a second portion of the processed input signal, a third isolation capacitor coupled to receive the first portion of the processed input signal from the first isolation capacitor, and a fourth isolation capacitor coupled to receive the second portion of the processed input signal from the second isolation capacitor; and
  providing the voltage isolated signal from the isolation circuit to a second semiconductor die coupled to the first semiconductor die via a bonding mechanism, the second semiconductor die not having isolation circuitry.

17. The method of claim 16, further comprising processing the voltage isolated signal in the second semiconductor die to obtain the input signal, and sending the input signal to selected circuitry of the second semiconductor die.

18. The method of claim 16, further comprising capacitively coupling the first and second semiconductor dies via the isolation circuit of the first semiconductor die.

* * * * *